United States Patent
Wang et al.

(10) Patent No.: US 8,922,220 B2
(45) Date of Patent: Dec. 30, 2014

(54) SHORT DETECTION CIRCUIT, LIGHT-EMITTING DIODE CHIP, LIGHT-EMITTING DIODE DEVICE AND SHORT DETECTION METHOD

(75) Inventors: Sih-Ting Wang, Kaohsiung County (TW); Chung-Wen Wu, Yilan County (TW); Chien-Cheng Tu, Hsinchu (TW); Chia-Chun Liu, Hsinchu County (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 568 days.

(21) Appl. No.: 13/010,783

(22) Filed: Jan. 21, 2011

(65) Prior Publication Data
US 2012/0068714 A1    Mar. 22, 2012

(30) Foreign Application Priority Data

Sep. 20, 2010 (TW) .............................. 99131845 A

(51) Int. Cl.
*G01R 31/00* (2006.01)
*G01R 31/02* (2006.01)
(52) U.S. Cl.
CPC .................................. *G01R 31/025* (2013.01)
USPC .................. 324/500; 324/537; 324/762.07
(58) Field of Classification Search
CPC ..... G01R 31/025; G01R 31/024; G01R 31/02
USPC ................. 324/414, 760.01, 555, 500, 537, 324/762.07; 362/5
See application file for complete search history.

(56) References Cited

U.S. PATENT DOCUMENTS

| | | | | |
|---|---|---|---|---|
| 3,948,081 A | * | 4/1976 | Wessel et al. | 73/23.21 |
| 4,287,437 A | * | 9/1981 | Brosch et al. | 327/160 |
| 5,304,935 A | * | 4/1994 | Rathke et al. | 324/415 |
| 6,147,617 A | * | 11/2000 | Kim | 340/664 |
| 6,166,893 A | * | 12/2000 | Shen et al. | 361/86 |
| 2002/0067179 A1 | * | 6/2002 | Takasugi et al. | 324/754 |
| 2003/0151418 A1 | * | 8/2003 | Leger | 324/715 |
| 2007/0229486 A1 | * | 10/2007 | Liu et al. | 345/213 |

FOREIGN PATENT DOCUMENTS

| | | |
|---|---|---|
| CN | 1780512 A | 5/2006 |
| CN | 101720148 A | 6/2010 |
| TW | 465257 | 11/2001 |
| TW | 200949268 | 12/2009 |

* cited by examiner

*Primary Examiner* — Arleen M Vazquez
*Assistant Examiner* — Robert P Alejnikov, Jr.
(74) *Attorney, Agent, or Firm* — Winston Hsu; Scott Margo

(57) ABSTRACT

A short detection circuit includes a voltage divider circuit, for generating, according to a bottom voltage of one or more light-emitting diode strings, a divided voltage less than the bottom voltage. Additionally, the short detection circuit includes a voltage clamp circuit, coupled to the voltage divider circuit, for clamping the divided voltage, and a comparator, coupled to the voltage divider circuit, for comparing the divided voltage and a reference voltage, to decide whether a short circuit occurs in the one or more light-emitting diode strings according to a result of the comparison.

16 Claims, 5 Drawing Sheets

US 8,922,220 B2

SHORT DETECTION CIRCUIT, LIGHT-EMITTING DIODE CHIP, LIGHT-EMITTING DIODE DEVICE AND SHORT DETECTION METHOD

BACKGROUND OF THE INVENTION

1. Field of the Invention

The disclosure relates to short detection, and more particularly, to a short detection circuit, an LED driving chip and an LED device thereof, and a short detecting method which are capable of avoiding high-voltage burnout during short detection.

2. Description of the Prior Art

Due to environmental concerns and technology advancement in recent years, light-emitting diodes (LEDs) have gradually replaced cold cathode fluorescent lamps (CCFLs) to become the main trend of screen backlights of computers and TVs. In a conventional LED device, in order to prevent an LED short event from causing high power consumption within an LED driving chip and even burning out the LED driving chip, a short detection circuit is usually disposed in the LED driving chip for detecting LED shorts, and further controlling an LED driving circuit within the LED driving chip to cut off a driving current when an LED short occurs.

Please refer to FIG. 1, which is a schematic diagram of a conventional LED device 10. The LED device 10 includes an LED string C1 and an LED driving chip 102. The LED driving chip 102 includes an LED driving circuit 104 and a comparator 106, i.e. a short detection circuit, for driving and performing short detection on the LED string C1, respectively. Noticeably, FIG. 1 only illustrates one LED string, one comparator and one driving circuit for simplicity. However, the LED device 10 can practically include a plurality of LED strings connected in parallel, a plurality of comparators, and a plurality of driving circuits. Each of the plurality of LED strings is similar with the LED string C1, and is driven and monitored for shorts by the corresponding driving circuit and comparator of the LED driving chip 102.

In detail, the LED driving circuit 104 provides a driving current to drive the LED string C1 according to a feedback voltage Vfb associated with the LED string C1, so as to maintain the feedback voltage Vfb and a boost voltage Vbst within reasonable ranges (e.g., around 20V-40V). The comparator 106 compares a bottom voltage Vbtm of the LED string C1 with a reference voltage Vref (e.g. 5-8 V) within the LED driving chip 102, and determines a short circuit occurs in the LED string C1 when the bottom voltage Vbtm is greater than the reference voltage Vref, so as to further control the LED driving circuit 104 to cut off the corresponding driving current.

Under this configuration, once a short circuit occurs in one or more LEDs of the LED string C1 to make a zero voltage drop across the one or more LEDs, the bottom voltage Vbtm will rise, becoming greater than the reference voltage Vref. At this moment, the comparator 106 can detect that the bottom voltage Vbtm is too high, and therefore determine that a short circuit occurs in the LED string C1, so as to further control the LED driving circuit 104 to cut off the driving current to the LED string C1.

After the LED driving circuit 104 cuts off the driving current of the LED string C1, the bottom voltage Vbtm rises further to a higher voltage level which is almost the same as that of the boost voltage Vbst. For the conventional LED driving chip 102 which is manufactured in a high operating voltage process, it can receive the high voltage level without being damaged. However, in a current trend toward system on chip (SOC) architectures, an LED driving chip is integrated with image processing circuits, and for purpose of achieving higher operating speed, manufactured in a low voltage process to have a low operating voltage often no more than 5V. In consideration of tendency of such a low-voltage single chip to be burned out when receiving a high voltage, there is a need for improvement of the conventional short detection circuit, so as to adapt to the low-voltage single-chip trend.

SUMMARY OF THE INVENTION

It is therefore one of the objectives of the embodiments to provide a short detection circuit, LED driving chip and LED device thereof, and a short detecting method, which can adapt to a low operating voltage chip.

An embodiment discloses a short detection circuit. The short detection circuit includes a voltage divider circuit, for generating, according to a bottom voltage of one or more light-emitting diode (LED) strings, a divided voltage less than the bottom voltage, a voltage clamp circuit, coupled to the voltage divider circuit, for clamping the divided voltage, and a comparator, coupled to the voltage divider circuit, for comparing the divided voltage with a reference voltage, to decide whether a short circuit occurs in the one or more LED strings according to a result of the comparison.

Another embodiment discloses a light-emitting diode (LED) driving chip. The LED driving chip includes a voltage clamp circuit, for clamping a divided voltage generated by a voltage divider circuit, wherein the voltage divider circuit is utilized for generating, according to a bottom voltage of one or more LED strings, the divided voltage less than the bottom voltage, a driving circuit, for generating a driving current to drive the one or more LED strings, and a comparator, for comparing the divided voltage with a reference voltage, to decide whether a short circuit occurs in the one or more LED strings according to a result of the comparison, and indicating the driving circuit to cut off the driving current when a short circuit occurs.

Further another embodiment discloses a short detecting method. The short detecting method includes steps of generating, according to a bottom voltage of one or more light-emitting diode (LED) strings, a divided voltage less than the bottom voltage, clamping the divided voltage, and comparing the divided voltage with a reference voltage, to decide whether a short circuit occurs in the one or more LED strings according to a result of the comparison.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
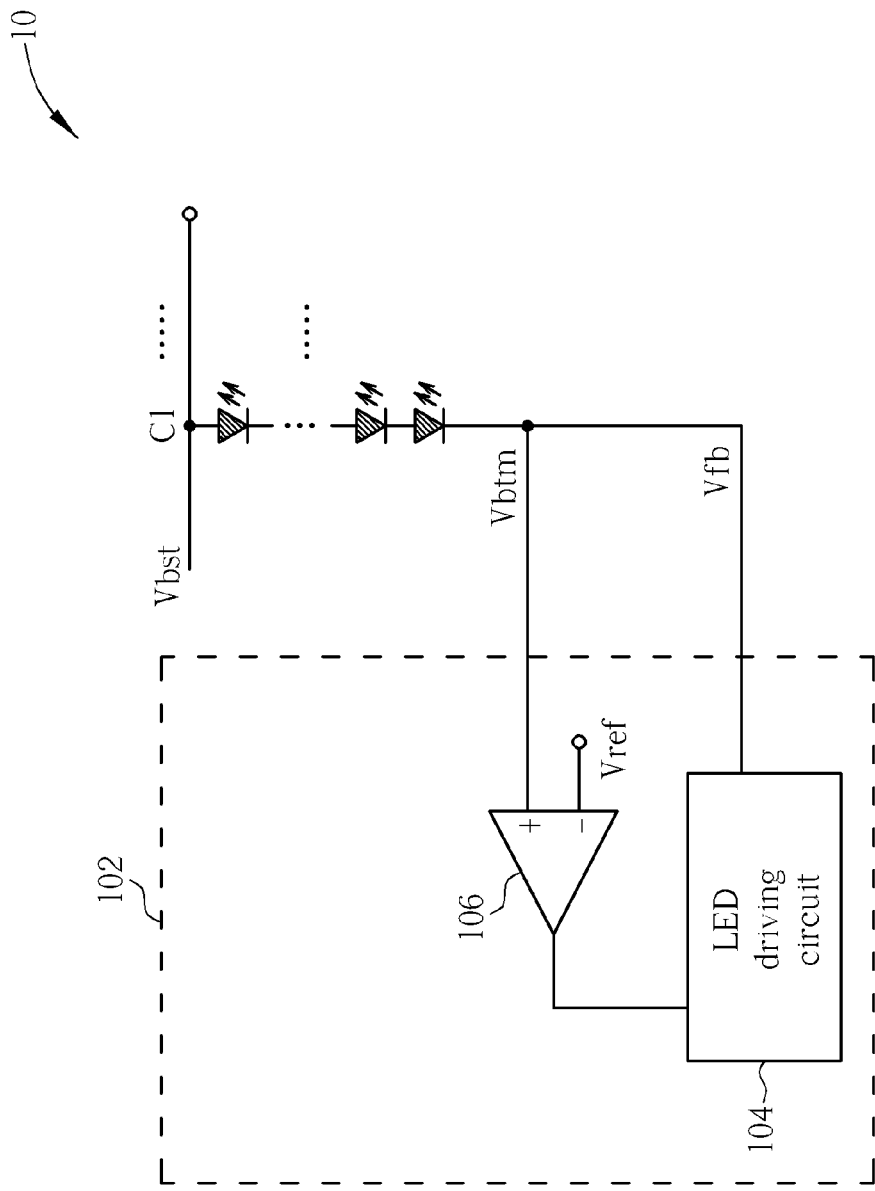
FIG. 1 is a schematic diagram of a conventional LED device.
Figure 2:
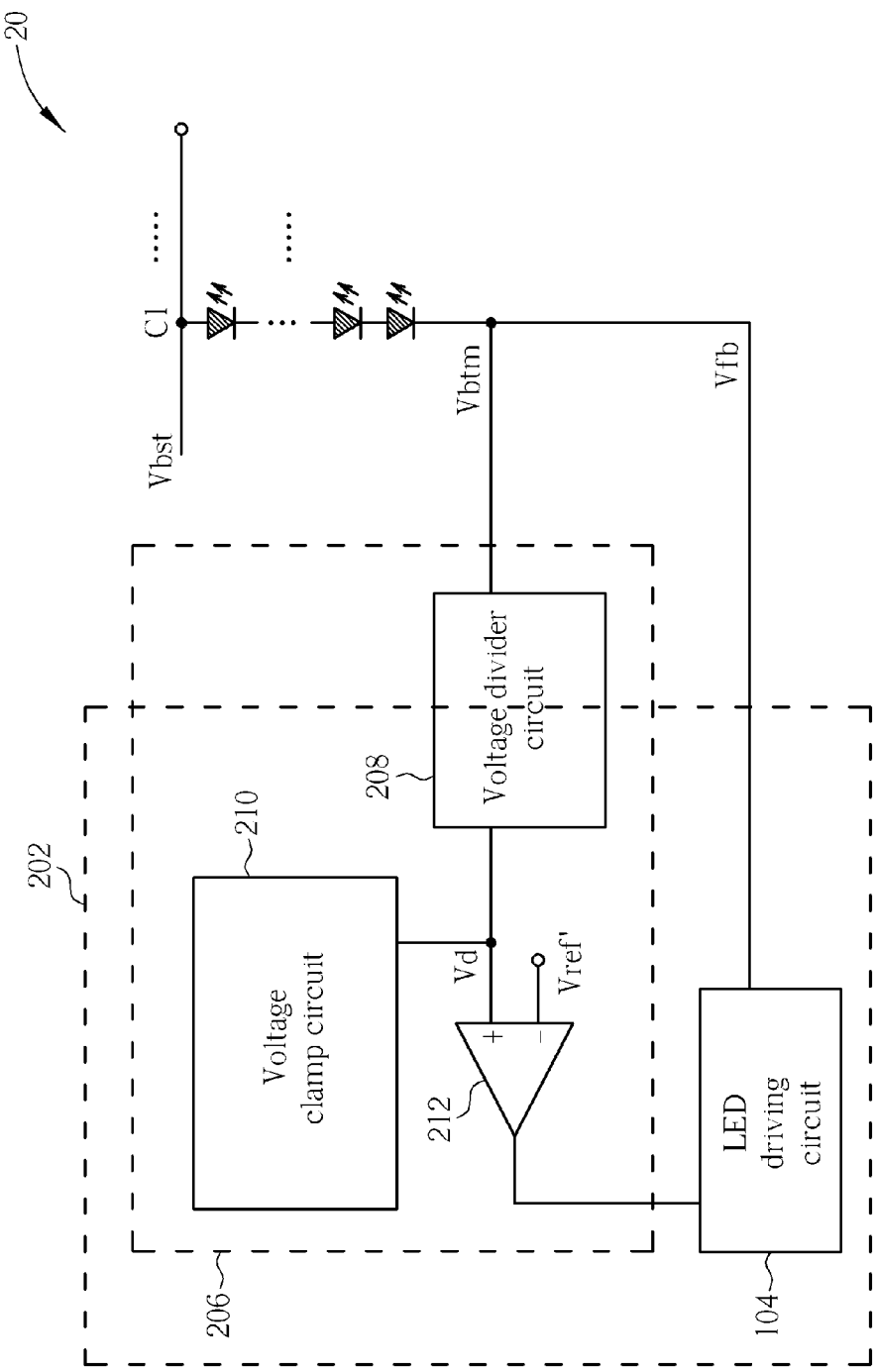
FIG. 2 is a schematic diagram of a structure of an LED device according to an embodiment of the present invention.

Please refer to FIG. 2, which is a schematic diagram of a structure of an LED device 20 according to an embodiment. The structure and operations of the LED device 20 are partially similar with those of the LED device 10, and thus elements and signals with the same functions are denoted by the same symbols. The main difference between the LED device 20 and the LED device 10 lies in that a short detection circuit 206 of the LED device 20 has a different structure from the short detection circuit (i.e. the comparator) 106 of the LED device 10. As is detailed below, the short detection circuit 206 can perform LED short detection without causing an LED driving chip 202 to be damaged by a high voltage.

In detail, the short detection circuit 206 includes a voltage divider circuit 208, a voltage clamp circuit 210 and a comparator 212. In other words, the addition of the voltage divider circuit 208 and the voltage clamp circuit 210 to the short detection circuit 206 is the main difference between the short detection circuit 206 and the conventional short detection circuit 106. Besides, the short detection circuit 206 can be integrated with the LED driving circuit 104 into the LED driving chip 202 partially (e.g., as shown in FIG. 2) or wholly.

The voltage divider circuit 208 generates, according to the bottom voltage Vbtm of the LED string C1, a divided voltage Vd which is less than the bottom voltage Vbtm. In FIG. 2, the voltage divider circuit 208 is disposed partially outside the LED driving chip 202 and partially inside the LED driving chip 202. In other embodiments, the voltage divider circuit 208 can be disposed entirely outside the LED driving chip 202, or entirely within the LED driving chip 202.

The voltage clamp circuit 210 can clamp the divided voltage Vd. Preferably, the voltage clamp circuit 210 clamps the divided voltage Vd to no more than, i.e. less than or equal to, a maximum voltage the LED driving chip 202 can tolerate without being burned out, namely, a tolerable voltage. More preferably, the voltage clamp circuit 210 clamps the divided voltage Vd to no more than a low operating voltage Vlp of the LED driving chip 202. The comparator 212 compares the divided voltage Vd with a reference voltage Vref', and determines a short circuit occurs in the LED string C1 when the divided voltage Vd is greater than the reference voltage Vref', so as to further control the LED driving circuit 104 to cut off the corresponding driving current. Similarly, the reference voltage Vref' can be designed to be no more than the tolerable voltage, and more preferably no more than the low operating voltage Vlp.

In a specific embodiment, the voltage clamp circuit 210 activates its clamping function according to the divided voltage Vd. Specifically, when a short circuit does not occur or a short circuit occurs but the driving current is not cut off, the divided voltage Vd is not high enough to activate the clamping function of the voltage clamp circuit 210. But, when a short circuit occurs, and the driving current is cutoff to cause the bottom voltage Vbtm to rise to a specific level (or a specific level range), the voltage clamp circuit 210 starts clamping the divided voltage Vd to maintain it at or around the specific level. The specific level can be designed to be no more than the tolerable voltage or the low operating voltage Vlp. As a result, no matter whether a short circuit occurs or not, the divided voltage Vd can be kept no more than the tolerable voltage or the low operating voltage Vlp.

To sum up, the voltage divider circuit 208 can prevent the LED driving chip 202 from directly receiving the bottom voltage Vbtm at a high voltage level when performing short detection. Besides, the voltage clamp circuit 210 can clamp the divided voltage Vd when a short circuit occurs to cause the driving current to be cut off and the bottom voltage Vbtm to rise. By cooperation between the voltage divider circuit 208 and the voltage clamp circuit 210, the LED driving chip 202 can be prevented from directly receiving a high voltage and being damaged.

Figure 3:
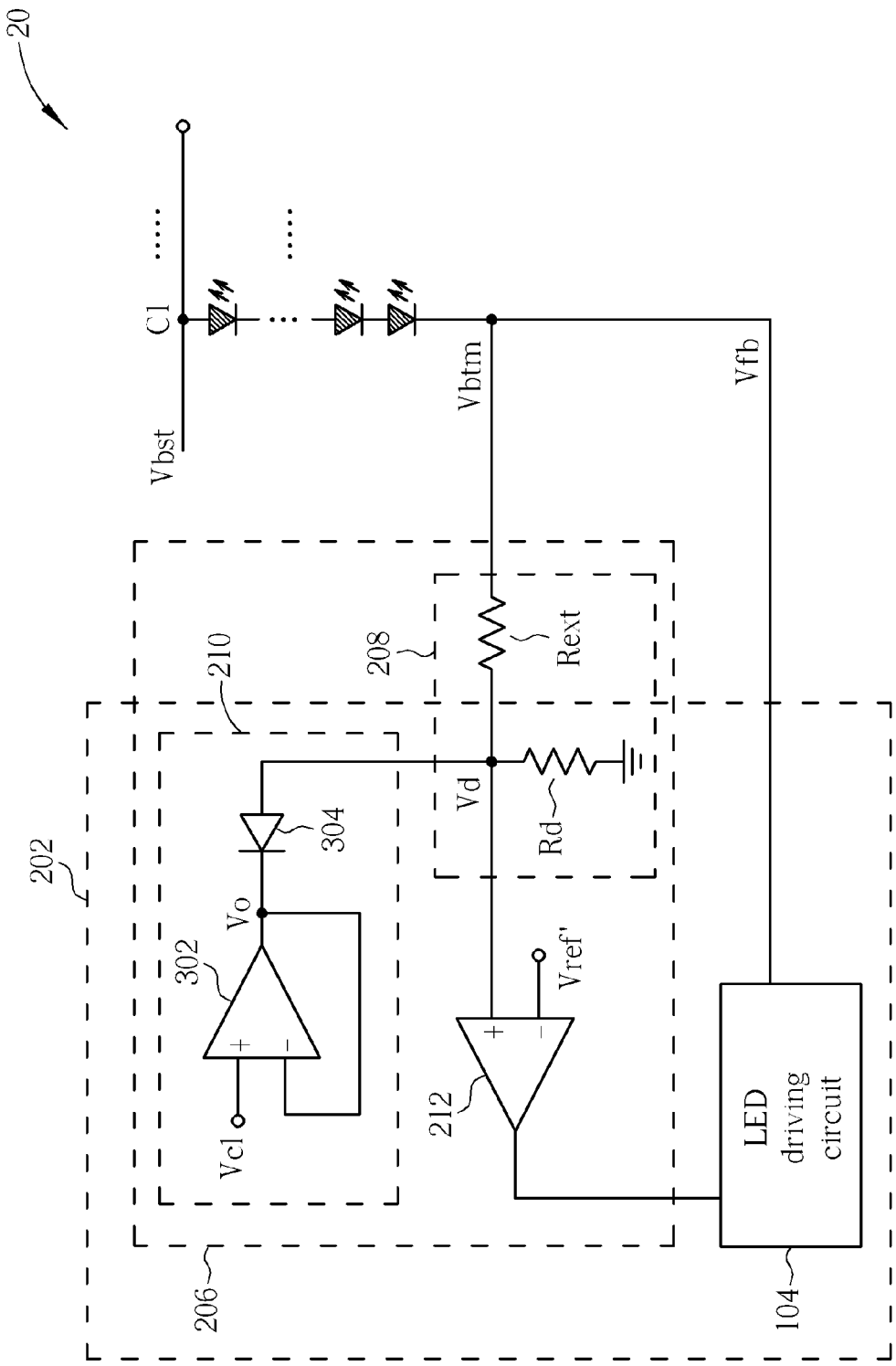
FIG. 3 is a schematic diagram of a detailed circuit of the LED device shown in FIG. 2 according to an embodiment of the present invention.
Figure 4:
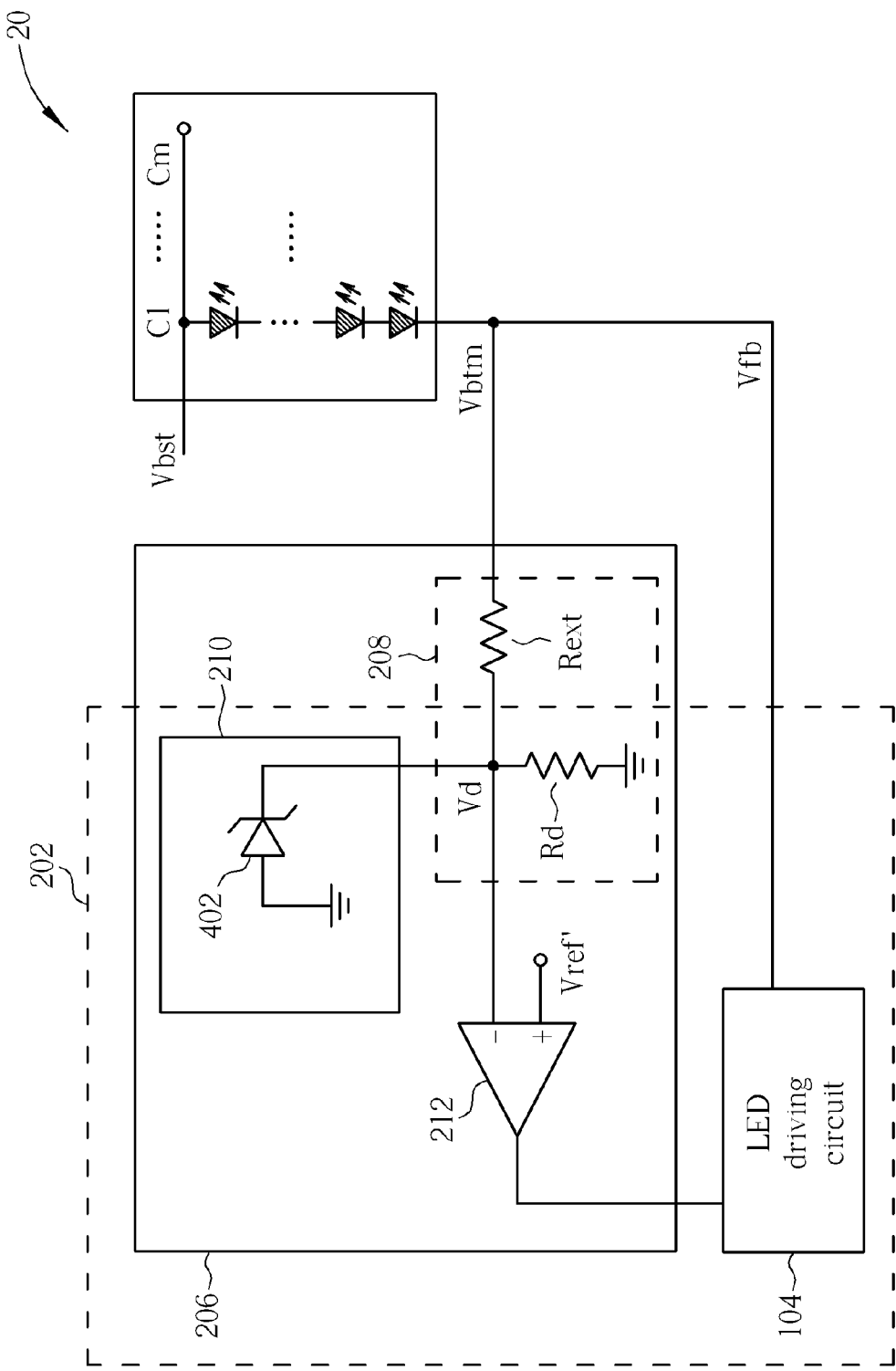
FIG. 4 is a schematic diagram of a detailed circuit of the LED device shown in FIG. 2 according to another embodiment of the present invention.

In FIG. 2, realizations of both the voltage divider circuit 208 and the voltage clamp circuit 210 are not limited to specific structures and operations. A variety of circuits with different structures can be utilized for realizing the voltage divider circuit 208 and the voltage clamp circuit 210. FIG. 3 and FIG. 4 illustrate detailed structures and operations of the voltage divider circuit 208 and the voltage clamp circuit 210 according to different embodiments.

Please refer to FIG. 3, which is a schematic diagram of a detailed circuit of the LED device 20 shown in FIG. 2 according to an embodiment. As shown in FIG. 3, the voltage divider circuit 208 includes a first resistor Rext and a second resistor Rd coupled to each other. The first resistor Rext receives the bottom voltage Vbtm, then the second resistor Rd outputs the divided voltage Vd less than the bottom voltage Vbtm to the comparator 212 within the LED driving chip 202, i.e. $Vd = Vbtm*Rd/(Rext+Rd)$. Accordingly, the comparator 212 can perform a comparing operation to determine whether a short circuit occurs. As a result, when the short detection circuit 206 performs short detection, the voltage inputted to the LED driving chip 202 is the divided voltage Vd at a lower level derived by dividing the bottom voltage Vbtm rather than the bottom voltage Vbtm at a higher level. The resistance ratio between the first resistor Rext and the second resistor Rd can be determined according to a desired level of the divided voltage Vd. For example, the resistance of the first resistor Rext can be greater than that of the second resistor Rd, so as to effectively lower down the divided voltage Vd. It is noted that, preferably, the first resistor Rext and the second resistor Rd can be disposed outside and inside the LED driving chip 202 respectively as shown in FIG. 3. In other embodiments, the first resistor Rext and the second resistor Rd can be designed both outside and inside the LED driving chip 202.

On the other hand, the voltage clamp circuit 210 includes a unit gain buffer 302 and a clamping diode 304. The unit gain buffer 302, having a first input terminal coupled to a clamp voltage Vcl, and a second input terminal and an outputting terminal coupled to each other, is used for maintaining an output voltage Vo of the outputting terminal at a level of the clamp voltage Vcl. Besides, the clamping diode 304 (e.g. a P-N junction diode), coupled between the outputting terminal of the unit gain buffer 302 and the divided voltage Vd, is used for maintaining a voltage drop across itself as a turn-on voltage Vc, e.g. about 0.7V, when being turned on. Therefore, after a short circuit occurs and the driving current is cut off to raise the bottom voltage Vbtm to a high voltage level of the boost voltage Vbst (around 20V-40V), the divided voltage Vd can rise to turn on the clamping diode 304, causing the voltage across the clamping diode 304 to be substantially a level of the turn-on voltage Vc. Meanwhile, the unit gain buffer 302 can maintain the output voltage V0 at the level of the clamp voltage Vcl, so as to further maintain the divided voltage Vd at a level of the clamp voltage Vcl plus the turn-on voltage Vc, i.e. $Vd = Vo + Vc = Vcl + Vc$. In other words, the level of the clamp voltage Vcl plus the turn-on voltage Vc in FIG. 3 is the specific level described in connection to FIG. 2, which can be designed to be less than or equal to the tolerable voltage or the low operating voltage Vlp of the LED driving chip 202. As a result, even when a short circuit occurs to cause the bottom voltage Vbtm to rise too high, the divided voltage Vd received by the LED driving chip 202 can be kept no more than the tolerable voltage or the low operating voltage Vlp and from burning out the LED driving chip 20. Noticeably, in other embodiments, the voltage clamp circuit 210 can be realized by a plurality of P-N junction diodes connected in series, or even along with other additional impedance elements, such as resistors.

For example, assume that the low operating voltage Vlp is 3.3V, in an exemplary circuit design, the first resistor Rext has resistance of 1 megaohm, the second resistor Rd has resistance of 180 k ohm, the reference voltage Vref is 1.2V, the clamp voltage Vcl is 1.6V and the boost voltage Vbst is 40V. Therefore, when the bottom voltage Vbtm of the LED string C1 is greater than 7.9V to make the divided voltage Vd greater than the reference voltage Vref of 1.2V, the comparator 212 can determine a short circuit occurs in the LED string C1, and further control the LED driving circuit 104 to cut off the driving current of the LED string C1, resulting in a rise of the bottom voltage Vbtm to the boost voltage Vbst of 40V. Simultaneously, the voltage clamp circuit 210 can clamp the divided voltage Vd to a sum of the clamp voltage Vcl and the turn-on voltage Vc, i.e. 2.3V, which is less than the low operating voltage Vlp of 3.3V. In comparison, without the implementation of the voltage clamp circuit 210, the divided voltage Vd would rise to 6.1V, which is far greater than the low operating voltage Vlp of 3.3V. Therefore, the embodiment can prevent the LED driving chip 202 from being damaged when the short detection circuit 206 receives a high voltage.

Please refer to FIG. 4, which is a schematic diagram of a detailed circuit of the LED device 20 shown in FIG. 2 according to another embodiment. A main difference between FIG. 4 and FIG. 3 is the structure of the voltage clamp circuit 210. As shown in FIG. 4, the voltage clamp circuit 210 can be realized by a Schottky diode 402. When a short circuit occurs and the driving current is cut off to cause the divided voltage Vd to rise too high, the reverse-biased Schottky diode 402 is break down, resulting in a voltage across the Schottky diode 402 substantially maintained at a fixed breakdown voltage Vbr. In other words, the breakdown voltage Vbr is the specific level described in connection to FIG. 2, and is no more than the tolerable voltage or the low operating voltage Vlp, e.g. 5V, of the LED driving chip 202. As a result, even if a short circuit occurs to cause the bottom voltage Vbtm to rise too high, the divided voltage Vd received by the LED driving chip 202 can be kept no more than the tolerable voltage or the low operating voltage Vlp and from burning out the LED driving chip 202. Noticeably, in another embodiment, the voltage clamp circuit 210 can be realized by a plurality of Schottky diodes connected in series, or one or more forward-biased P-N junction diodes, even along with other additional impedance elements such as resistors. On the other hand, the voltage divider circuit 208 shown in FIG. 4 is the same as that shown in FIG. 3, but is not limited to that circuit structure, as long as the voltage divider circuit 208 can achieve the voltage dividing function.

Noticeably, in FIG. 2, the voltage divider circuit 208 and the voltage clamp circuit 210 perform voltage dividing and voltage clamping operations, respectively, and realizations thereof are not limited to any specific rule. Those skilled in the art may make modifications or alterations accordingly, which are not limited to the detailed structures and operations shown in FIG. 3 and FIG. 4.

Noticeably, similar to FIG. 1, FIG. 2 to FIG. 4 all illustrate only one LED string, one clamp circuit, one voltage divider circuit, one comparator and one driving circuit for simplicity. However, the LED device 10 can practically include one or more sets of LED strings, one or more clamp circuits, one or more voltage divider circuits, one or more comparators, and one or more driving circuits. Each set of LED strings including one or more LED strings is driven by the corresponding driving circuit in the LED driving chip 202, and is monitored for shorts by the corresponding clamp circuit and comparator voltage divider circuit. Detailed structures and operations are similar to the above description, and are not narrated hereinafter.

Figure 5:
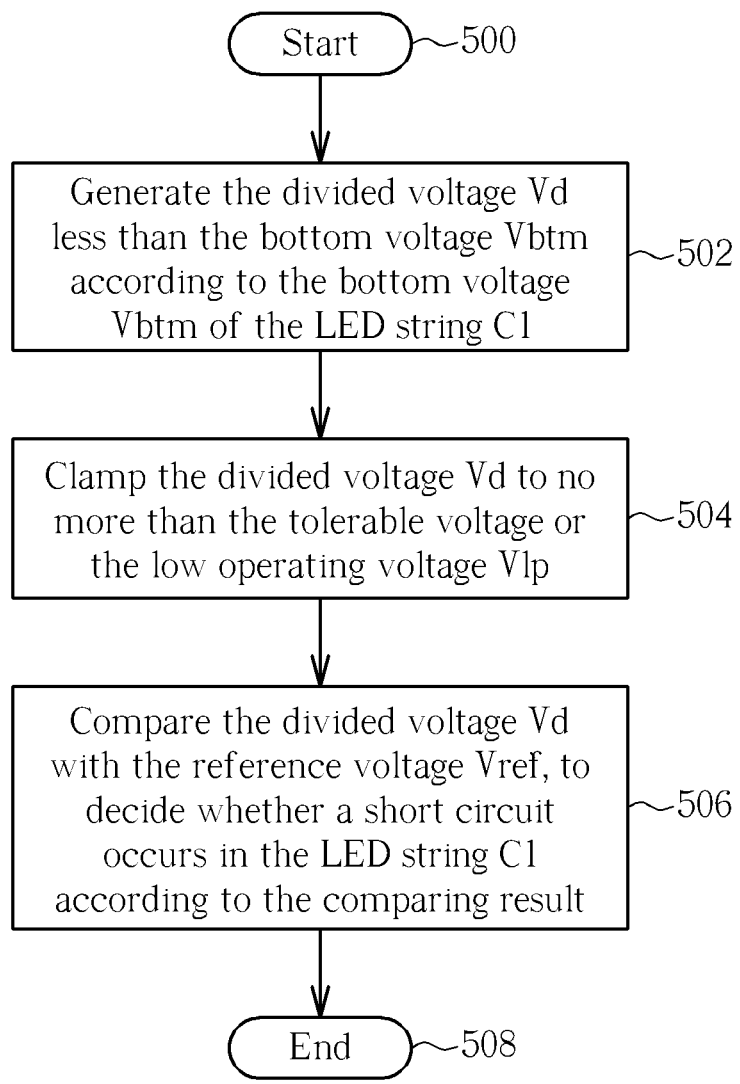
FIG. 5 is a schematic diagram of a short detecting process according to an embodiment of the present invention.

Short detecting operations of the short detection circuit 206 can be summarized into a short detecting process 50 as shown in FIG. 5. The short detecting process 50 includes the following steps:

Step 500: Start.
Step 502: Generate the divided voltage Vd less than the bottom voltage Vbtm according to the bottom voltage Vbtm of the LED string C1.
Step 504: Clamp the divided voltage Vd to no more than the tolerable voltage or the low operating voltage Vlp.
Step 506: Compare the divided voltage Vd with the reference voltage Vref, to decide whether a short circuit occurs in the LED string C1 according to the comparing result.
Step 508: End.

Details of each step can be derived by referring to operations of corresponding elements in the short detection circuit 206, and are not narrated hereinafter.

The above embodiments do not directly receive a high voltage but utilize a lower divided voltage to perform short detection, and further clamp the divided voltage, so as to prevent the chip from being damaged during short detection. Specifically, by generating a divided voltage Vd less than the bottom voltage Vbtm and performing short detection according to the divided voltage Vd, the embodiments can prevent the high level of the bottom voltage Vbtm from directly entering the LED driving chip 202. Furthermore, by clamping the divided voltage Vd inside the LED driving chip 202 to less than the tolerable voltage or the low operating voltage Vlp of the chip, the above embodiments can maintain the divided voltage Vd at a low voltage level, even when a short circuit occurs to cause the driving current to cut off and the bottom voltage Vbtm to rise too high. As a result, the LED driving chip can be prevented from being damaged during short detection.

To sum up, in the current trend toward SOCs and requirements for high operating speed, the LED driving chip is not only integrated with image processing circuits but is also manufactured in a low operating voltage process. However, the prior art directly receives the bottom voltage Vbtm for short detection, resulting in damage to the chip by the high voltage. In comparison, the above embodiments, by utilizing a lower divided voltage rather than a high voltage in performing short detection, and further clamping the divided voltage, can prevent the chip from being damaged by the high voltage, and can therefore adapt to the trend to low-voltage single chips.

Those skilled in the art will readily observe that numerous modifications and alterations of the device and method may be made while retaining the teachings of the invention.

What is claimed is:
1. A short detection circuit, comprising:
a voltage divider circuit, for generating, according to a bottom voltage of one or more light-emitting diode (LED) strings, a divided voltage less than the bottom voltage;
a voltage clamp circuit, coupled to the voltage divider circuit, for clamping the divided voltage such that the divided voltage is maintained substantially at a first voltage level; and a comparator, coupled to the voltage divider circuit, for comparing the divided voltage with a reference voltage, to decide whether a short circuit occurs in the one or more LED strings according to a result of the comparison;

wherein the voltage clamp circuit starts clamping the divided voltage substantially to the first voltage level when the bottom voltage rises to a second voltage level, and then continuously maintains the divided voltage substantially to the first voltage level when the bottom voltage is continuously equal to or greater than the second voltage level.

2. The short detection circuit of claim 1, wherein the voltage clamp circuit clamps the divided voltage to no more than one of a tolerable voltage and a low operating voltage of a chip.

3. The short detection circuit of claim 1, wherein the voltage clamp circuit clamps the divided voltage after a driving current received by the one or more LED strings is cut off and the bottom voltage rises.

4. The short detection circuit of claim 1, wherein the voltage divider circuit comprises:
a first resistor, coupled to the bottom voltage; and
a second resistor, coupled to the first resistor, for outputting the divided voltage.

5. The short detection circuit of claim 1, wherein the voltage clamp circuit comprises:
a unit gain buffer, having a first input terminal coupled to a clamp voltage, and a second input terminal and an outputting terminal coupled to each other, for maintaining a voltage of the outputting terminal at a level of the clamp voltage; and
a clamping diode, coupled between the voltage divider circuit and the outputting terminal, for maintaining a voltage across itself as a turn-on voltage when being turned on.

6. The short detection circuit of claim 1, wherein the voltage clamp circuit comprises at least one Schottky diode, coupled to the voltage divider circuit, for generating a breakdown voltage to clamp the divided voltage.

7. A light-emitting diode (LED) driving chip, comprising:
a voltage clamp circuit, for clamping a divided voltage such that the divided voltage is maintained substantially at a first voltage level, wherein the divided voltage is generated from a bottom voltage of one or more LED strings and is at a level less than the bottom voltage;
a driving circuit, for generating a driving current to drive the one or more LED strings; and
a comparator, for comparing the divided voltage with a reference voltage, to decide whether a short circuit occurs in the one or more LED strings according to a result of the comparison, and indicating the driving circuit to cut off the driving current when a short circuit occurs;

wherein the voltage clamp circuit starts clamping the divided voltage substantially to the first voltage level when the bottom voltage rises to a second voltage level, and then continuously maintains the divided voltage substantially to the first voltage level when the bottom voltage is continuously equal to or greater than the second voltage level.

8. The LED driving chip of claim 7, wherein the LED driving chip is a low operating voltage chip manufactured in a low operating voltage process.

9. The LED driving chip of claim 7, further comprising at least one part of the voltage divider circuit.

10. A light-emitting diode (LED) device, comprising:
one or more LED strings; and
the LED driving chip of claim 7, for driving the one or more LED strings and detecting whether a short circuit occurs in the one or more LED strings.

11. A short detecting method, comprising:
generating, according to a bottom voltage of one or more light-emitting diode (LED) strings, a divided voltage less than the bottom voltage;
clamping the divided voltage such that the divided voltage is maintained substantially at a first voltage level; and
comparing the divided voltage with a reference voltage, to decide whether a short circuit occurs in the one or more LED strings according to a result of the comparison;
wherein the step of clamping the divided voltage comprises clamping the divided voltage substantially to the first voltage level when the bottom voltage rises to a second voltage level, and then continuously maintaining the divided voltage substantially to the first voltage level when the bottom voltage is continuously equal to or greater than the second voltage level.

12. The short detecting method of claim 11, wherein the step of clamping the divided voltage comprises clamping the divided voltage to no more than one of a tolerable voltage and a low operating voltage of a chip.

13. The short detecting method of claim 11, wherein the step of clamping the divided voltage is implemented after a driving current received by the one or more LED strings is cut off and the bottom voltage rises.

14. The short detecting method of claim 11, wherein the step of generating the divided voltage comprises:
coupling a first resistor to the bottom voltage; and
coupling a second resistor to the first resistor, for outputting the divided voltage.

15. The short detecting method of claim 11, wherein the step of clamping the divided voltage comprises:
coupling a first input terminal of a unit gain buffer to a clamp voltage, and coupling a second input terminal of the unit gain buffer to an outputting terminal of the unit gain buffer, to maintain a voltage of the outputting terminal at a level of the clamp voltage; and
coupling a clamping diode between the voltage divider circuit and the outputting terminal, to maintain a turn-on voltage when the clamping diode is turned on.

16. The short detecting method of claim 11, wherein the step of clamping the divided voltage comprises coupling at least one Schottky diode to the voltage divider circuit, to generate a breakdown voltage to clamp the divided voltage

* * * * *